(12) United States Patent
Chaivipas

(10) Patent No.: US 9,496,860 B2
(45) Date of Patent: Nov. 15, 2016

(54) PHASE CONTROL CIRCUIT AND RECEIVING DEVICE

(71) Applicant: FUJITSU LIMITED, Kawasaki-shi, Kanagawa (JP)

(72) Inventor: Win Chaivipas, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/832,756

(22) Filed: Aug. 21, 2015

(65) Prior Publication Data

US 2016/0087616 A1   Mar. 24, 2016

(30) Foreign Application Priority Data

Sep. 18, 2014   (JP) .................................. 2014-189944

(51) Int. Cl.
| | |
|---|---|
| *H03K 17/00* | (2006.01) |
| *H03K 5/13* | (2014.01) |
| *H03K 5/00* | (2006.01) |

(52) U.S. Cl.
CPC ....... *H03K 5/13* (2013.01); *H03K 2005/00052* (2013.01); *H03K 2005/00286* (2013.01)

(58) Field of Classification Search
None
See application file for complete search history.

(56) References Cited

U.S. PATENT DOCUMENTS

| | | | | |
|---|---|---|---|---|
| 6,133,773 | A * | 10/2000 | Garlepp | .................... H03K 5/13 327/231 |
| 9,208,130 | B1 * | 12/2015 | Chen | ........................ G06F 17/17 |
| 2007/0222530 | A1 | 9/2007 | Rhee et al. | |
| 2013/0207708 | A1 * | 8/2013 | Agrawal | ................. H04L 27/01 327/237 |

FOREIGN PATENT DOCUMENTS

| | | |
|---|---|---|
| JP | 11-275066 A | 10/1999 |
| JP | 2006-140639 A | 6/2006 |
| JP | 2009-529271 A | 8/2009 |

* cited by examiner

*Primary Examiner* — Cassandra Cox
(74) *Attorney, Agent, or Firm* — Arent Fox LLP

(57) ABSTRACT

A phase control circuit includes: a phase interpolation circuit including a first transistor connected between a power source and an output terminal, and configured to output an output signal from the output terminal by combining input signals having different phases with each other based on a ratio of input bias currents; a bias circuit configured to control an ON-resistance of the first transistor by adjusting a gate voltage of the first transistor based on a total amount of the input bias currents, and to maintain an output common voltage of the phase interpolation circuit regardless of the total amount; and a current controller configured to control a through rate of the output signal with respect to the input signals by adjusting the total amount.

6 Claims, 15 Drawing Sheets

PHASE CONTROL CIRCUIT AND RECEIVING DEVICE

CROSS-REFERENCE TO RELATED APPLICATION

This application is based upon and claims the benefit of priority from the prior Japanese Patent Application No. 2014-189944 filed on Sep. 18, 2014, the entire contents of which are incorporated herein by reference.

FIELD

The embodiments discussed herein are related to a phase control circuit and a receiving device.

BACKGROUND

In an interface circuit transmitting or receiving data between, for example, circuit boards or between large scale integrated circuits (LSI), a multi-phase clock has been used to sample the data to a plurality of timing.

For example, in a high speed signal transmission system, the receiving device samples data transmitted from the transmitting device by using a multi-phase clock so as to receive the data. In the system using the multi-phase clock, a phase interpolation circuit may be used to control the phase of the sampling clock.

The phase interpolation circuit determines the phase of an output signal (e.g., sampling clock) by interpolating the phase of a plurality of input signals (e.g., reference clock) based on a phase code.

Related technologies are disclosed in, for example, Japanese Laid-Open Patent Publication No. 2006-140639 and Japanese National Publication of International Patent Application No. 2009-529271.

SUMMARY

According to an aspect of the invention, a phase control circuit includes: a phase interpolation circuit including a first transistor connected between a power source and an output terminal, and configured to output an output signal from the output terminal by combining a plurality of input signals having different phases with each other based on a ratio of a plurality of input bias currents; a bias circuit configured to control an ON-resistance of the first transistor by adjusting a gate voltage of the first transistor based on a total amount of the plurality of input bias currents, and to maintain an output common voltage of the phase interpolation circuit regardless of the total amount; and a current controller configured to control a through rate of the output signal with respect to the plurality of input signals by adjusting the total amount.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

According to a through rate (indicating a change speed (or a response speed) of a signal) of an output signal corresponding to an input signal inputted to a phase interpolation circuit used to control the phase of the sampling clock, there might be a case where the phase may not be adjusted to an intended output signal phase even though a phase code is used to interpolate the phase of a plurality of input signals.

For example, when the through rate is too high, there is a possibility that the drain voltage of a transistor used in the phase interpolation circuit is clipped as a power source to be saturated, and the waveform of an output signal may be distorted depending on the phase source to be adjusted. Accordingly, by adjusting the through rate, it is considered that the deterioration of the phase adjustment precision may be suppressed. For example, while it is considered that the total value of an input bias current with respect to an input signal inputted to a phase interpolation circuit may be adjusted, in that case, the output common voltage may be changed and the operation of, for example, a circuit of a next step may be effected.

Hereinafter, embodiments of the present disclosure of a precise adjusting of a phase of an output signal of a phase interpolation circuit will be described in detail with reference to the drawings.

First Embodiment

Figure 1:
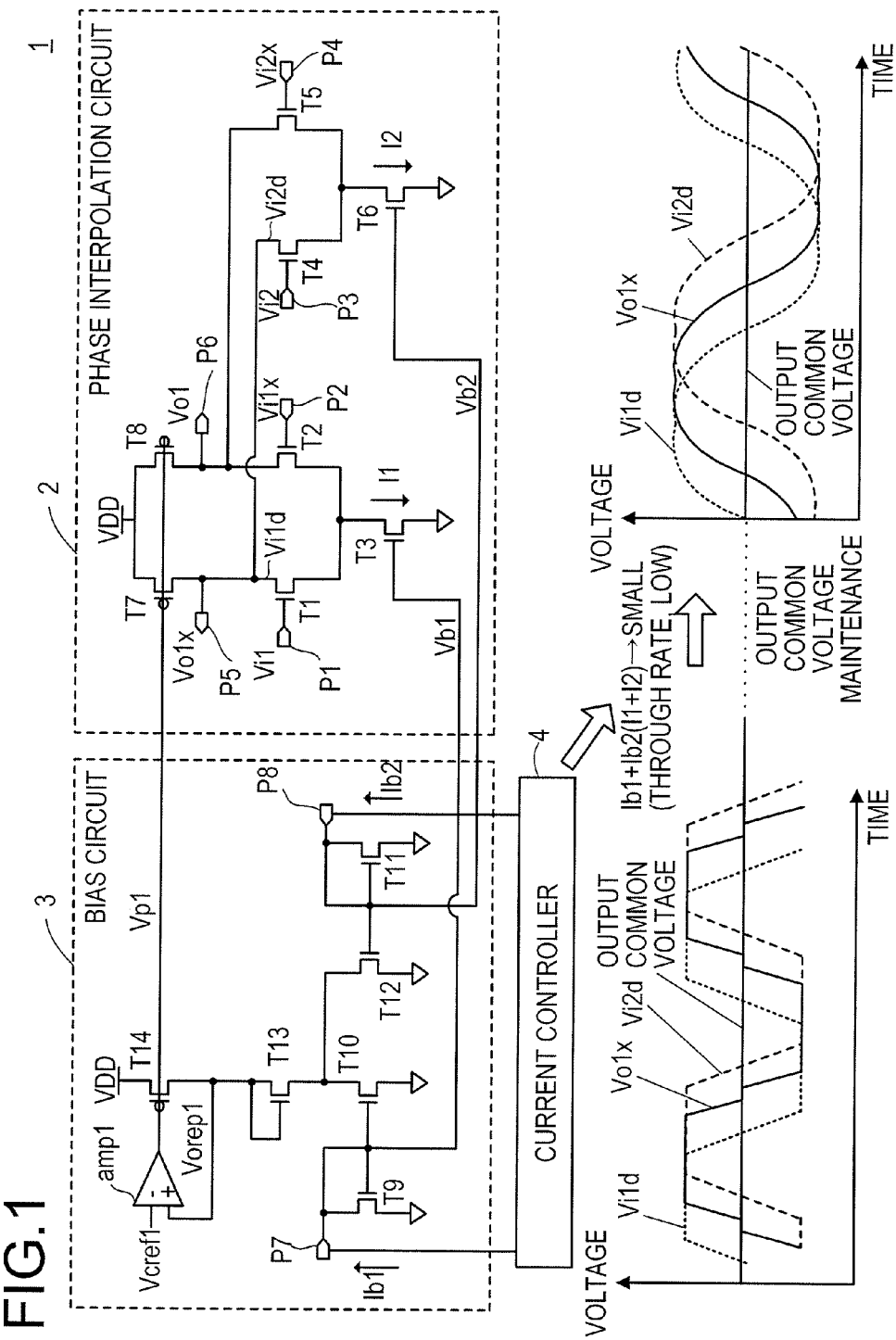
FIG. 1 is a drawing illustrating an exemplary phase control circuit according to an embodiment of the present disclosure.

FIG. 1 is a drawing illustrating an exemplary phase control circuit according to an embodiment of the present disclosure. A phase control circuit 1 includes a phase interpolation circuit 2, a bias circuit 3, and a current controller 4. The phase control circuit 1 includes transistors T1, T2, T3, T4, T5, T6, T7, and T8.

Hereinafter, the transistors (T1-T6) will be described as n-channel type MOSFET (Metal-Oxide Semiconductor Field Effect Transistor), and the transistors (T7-T) will be described as p-channel type MOSFET. In addition, the input signals Vi1, Vi1x, Vi2, and Vi2x, are, for example, reference signals, and, provided from, for example, an oscillation circuit (not illustrated). The phase difference between the input signal Vi1 and the input signal Vi1x is 180 degrees. The phase difference between the input signal Vi2 and the input signal Vi2x is 180 degrees. In addition, the phase difference between the input signal Vi2 and the input signal Vi1 is, for example, 90 degrees, and the phase difference between the input signal Vi2x and the input signal Vi1x is, for example, 90 degrees.

An input terminal P1 is connected to the gate of the transistor T1 and the input signal Vi1 is inputted to the input terminal P1, and an input terminal P2 is connected to the gate of the transistor T2 and the input signal Vi1x is inputted to the input terminal P2.

Each source of the transistors T1, and T2 is connected to the drain of the transistor T3. In addition, the drain of the transistor T1 is connected to the drain of the transistor T7 and an output terminal P5, and the drain of the transistor T2 is connected to the drain of the transistor T8 and an output terminal P6. The phase difference between the output signal Vo1x outputted from the output terminal P5 and the output signal Vo1 outputted from the output terminal P6 is, for example, 180 degrees.

The source of the transistor T3 is grounded, and a bias voltage Vb1 is applied to the gate of the transistor T3. When the bias voltage Vb1 is applied, the transistor T3 enables an input bias current (hereinafter, simply referred to as a bias current) (I1) to flow between the drain and source of the transistor T3.

The input terminal P3 is connected to the gate of the transistor T4 and the input signal Vi2 is inputted to the input terminal P3. The input terminal P4 is connected to the gate of the transistor T5 and the input signal Vi2x is inputted to the input terminal P4.

Each source of the transistors T4, T5 is connected to the drain of the transistor T6. In addition, the drain of the transistor T4 is connected to the drain of the transistor T7 and the output terminal P5, and the drain of the transistor T5 is connected to the drain of the transistor T8 and the output terminal P6.

The source of the transistor T6 is grounded, and the bias voltage V2b is applied to the gate of the transistor T6. When the bias voltage Vb2 is applied, the transistor T6 enables an input bias current I2 to flow between the drain and source of the transistor T6.

The transistors T7, T8 are connected between the power source VDD and the input terminals P5, P6, respectively, and function as a load resistor of two input differential pair (transistors T1, T2, and transistors T3, T4) in the phase interpolation circuit 2. The gate voltage of the transistors T7, T8 is controlled by the bias circuit 3, a voltage Vp1 is supplied from the bias circuit 3 as the gate voltage. In addition, the power source VDD is connected to each source of the transistors T7, T8.

The phase interpolation circuit 2, based on a ratio of the bias current I1, I2, outputs an output signal having a phase different from the phase of the input signal (e.g., an output signal Vo1) by combining the input signals (e.g. the input signal Vi1 and the input signal Vi2) having different phases with each other.

The bias circuit 3 includes transistors T9, T10, T11, T12, T13, T14, and a comparison circuit amp 1 (hereinafter, referred to as an operational amplifier. Hereinafter, the transistors T9-T13 will be described as n-channel type MOSET, and the transistor T14 will be described as p-channel type MOSFET.

The bias current Ib1 is supplied from the current controller 4 to the drain of the transistor T9 through a terminal P7, and the source of the transistor T9 is grounded. The gate of the transistor T9 is connected to its own drain, a gate of the transistor T10 and the gate of the transistor T3 of the phase interpolation circuit 2. As a result, the gate voltage of the transistor T9 is applied to the gate of the transistor T3 as a bias voltage Vb1.

The source of the transistor T10 is grounded, and the drain of the transistor T10 is connected to the source of the transistor T13 and the drain of the transistor T12.

The bias current Ib2 is supplied from the current controller 4 to the drain of the transistor T8 through a terminal P8, and the source of the transistor T11 is grounded. The gate of the transistor T11 is connected to its own drain, the gate of the transistor T12 and the gate of the transistor T6 of the phase interpolation circuit 2. As a result, the gate voltage of the transistor T12 is applied to the gate of the transistor T6 as a bias voltage Vb2.

The source of the transistor T12 is grounded, and the drain of the transistor T12 is connected to the source of the transistor T13 and the drain of the transistor T10.

The drain of the transistor T13 is connected to its gate, the drain of the transistor T14 and a non-inverted input terminal of the operational amplifier amp1.

The gate of the transistor T14 is connected to the gate of the transistors T7, T8 and the input terminal of the operational amplifier amp1. The power source VDD is connected to the source of the transistor T14.

A constant reference voltage Vcref1 is applied to the non-inverted terminal of the operational amplifier amp1. The reference voltage Vcref1 may be generated from, for example, a voltage generation unit (not illustrated).

The bias circuit 3, based on the total value of the bias currents I1, I2, controls the ON-resistance by adjusting the gate voltage of the transistors T7, T8, and maintains an output common voltage of the phase interpolation circuit 2 regardless of the total value of the bias currents I1, I2.

The current controller 4 controls the through rate of a plurality of input signals Vi1, Vi1x, Vi2, and Vi2x by adjusting the total value of the bias currents I1, I2 with the bias currents Ib1, Ib2. For example, when the through rate is set to be low, the current controller 4 sets the total value of the bias currents Ib1, Ib2 to be small, and when the through rate is set to be relatively high, the current controller 4 sets the total value of the bias currents Ib1, Ib2 to be relatively large.

Hereinafter, the operation of the phase control circuit 1 will be described according to an embodiment of the present disclosure. First of all, the relationship between the ratio of the bias currents I1, I2 of the phase interpolation circuit 2 and the phase of the generated output signal will be described.

Figure 2:
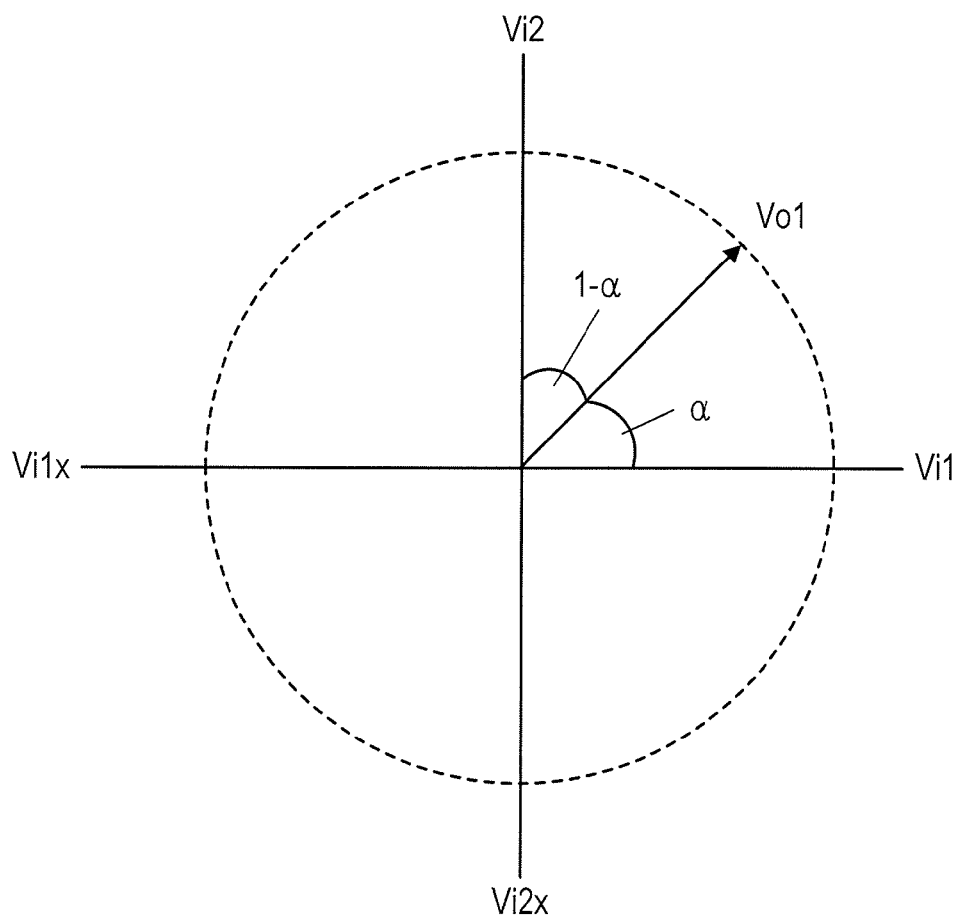
FIG. 2 is a drawing explaining an exemplary relationship between the ratio of a bias current and the phase of an input signal and an output signal.

FIG. 2 is a drawing explaining an exemplary relationship between the ratio of the bias current and the phase of the input and output signals. In addition, the ratio of the bias currents I1, I2 is considered as $\alpha:1-\alpha$ ($0<\alpha<1$) (hereinafter, α is referred as an interpolation coefficient). The interpolation coefficient α is set according to the phase code.

In an example of FIG. 2, the phase of the input signal Vi1 is 0 degree, the phase of the input signal Vi2 is 90 degrees, the phase of the input signal Vi1x is 180 degrees, and the phase of the input signal Vi2x is 270 degrees.

The output signal Vo1 is generated by combining the results of multiplexing α and 1–α, to the input signals Vi1, Vi2, respectively. Accordingly, as the value of the interpolation coefficient α becomes larger, the phase of the output signal Vo1 becomes closer to the phase of the output signal Vi2. In addition, as the value of the interpolation coefficient α becomes smaller, the phase of the output signal Vo1 becomes closer to the phase of the input signal Vi1.

In order to precisely adjust the phases of the output signals Vo1, Vo1x by controlling the ratio of the bias currents I1, I2 using the interpolation coefficient α, it is desirable that the phases of the output signals Vo1, Vo1x are linearly changed with respect to the interpolation coefficient α. However, for example, if the rising speed of the drain voltages Vi1d, Vi2d of the transistors T1, T4 of the phase interpolation circuit 2 too fast (hereinafter, referred to as when through rate is high), the waveform of the output signal Vo1x may be distorted. Hereinafter, descriptions will be made on this.

First of all, referring to FIG. 3 and FIG. 4, the output signal Vo1x and the change of shift amount of the phase will be described when the rising speed of the voltages Vi1d, Vi2d is relatively low (hereinafter referred to as when the through rate is low).

Figure 3:
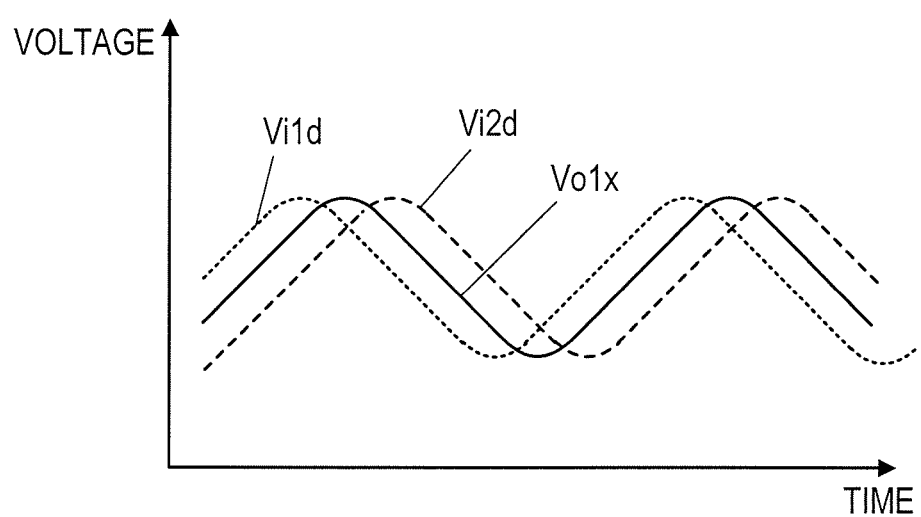
FIG. 3 is a drawing illustrating an exemplary waveform of voltages $Vi1d$, $Vi2d$ and an output signal $Vo1x$ at a low through rate.

FIG. 3 is a drawing illustrating exemplary waveforms of the voltages Vi1d, Vi2d and an output signal Vo1x at a low through rate. The horizontal axis represents time, and the vertical axis represents voltage. When the through rate is low, as illustrated in FIG. 3, the output signal Vo1x corresponding to the change of the voltage level of the voltages Vi1d, Vi2d is outputted. As a result, the shape of the waveform of the output signal Vo1x becomes the same as the waveform of the input signals Vi1, Vi2, and the shape of the waveforms are not distorted.

Figure 4:
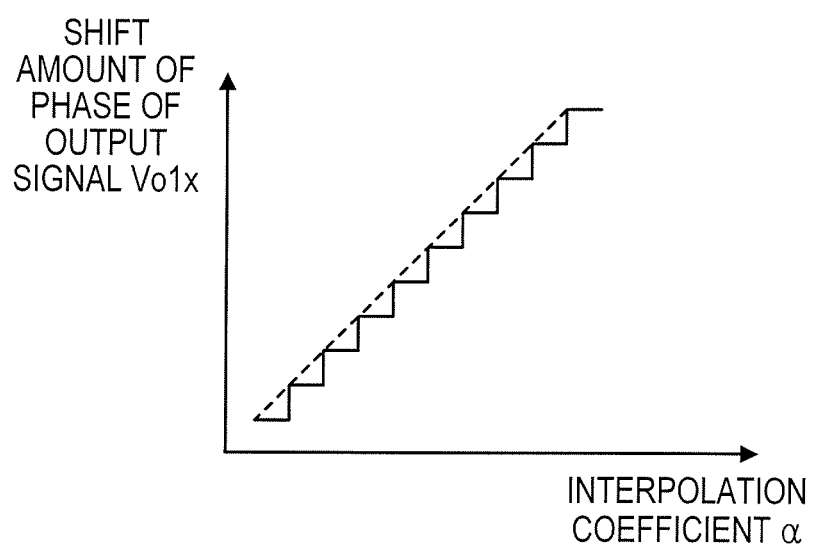
FIG. 4 is a drawing illustrating an exemplary relationship of an interpolation coefficient (a) and an amount of phase shift of an output signal at a low through rate.

FIG. 4 is a drawing illustrating an exemplary relationship between the interpolation coefficient α and the amount of phase shift of an output signal at a low through rate. The horizontal axis represents the interpolation coefficient α and the vertical axis represents an amount of the phase shift of the output signal Vo1x. The interpolation coefficient α may be adjusted at a constant step according to the phase code that is a digital code generated in the control unit (not illustrated). In a case where the shift amount of the phase is changed at a constant step when the interpolation coefficient α is changed at r the constant step, it is possible to precisely adjust the phase.

When the through rate is low, as illustrated in dotted line, the shift amount of the phase of the output signal Vo1x is changed at a constant step corresponding to the change of the interpolation coefficient α. Consequently, the shift amount of the phase of the output signal Vo1x, as illustrated in dotted line, is linearly changed with respect to the change of the interpolation coefficient α.

Figure 5:
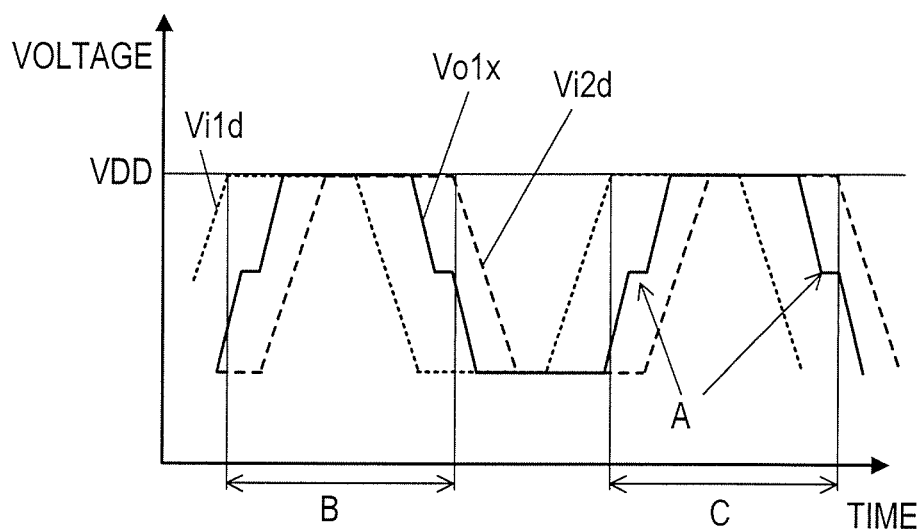
FIG. 5 is a drawing illustrating an exemplary waveform of voltages $Vi1d$, $Vi2d$ and an output signal at a high through rate.

Meanwhile, for example, when the through rate is high, the waveforms of the voltages will likely be as follows. FIG. 5 is a drawing illustrating exemplary waveforms of voltages Vi1d, Vi2d and an output signal at a high through rate. The horizontal axis represents time, and the vertical axis represents a voltage.

When the through rate is high, the voltages Vi1d, Vi2d may be clipped with the power source voltage supplied from the power source VDD to be saturated, as illustrated in the sections of B and C of FIG. 5. At this time, the waveform of the output signal Vo1x is distorted, and, for example, as illustrated by arrow A, the rise or fall becomes non-linear.

Figure 6:
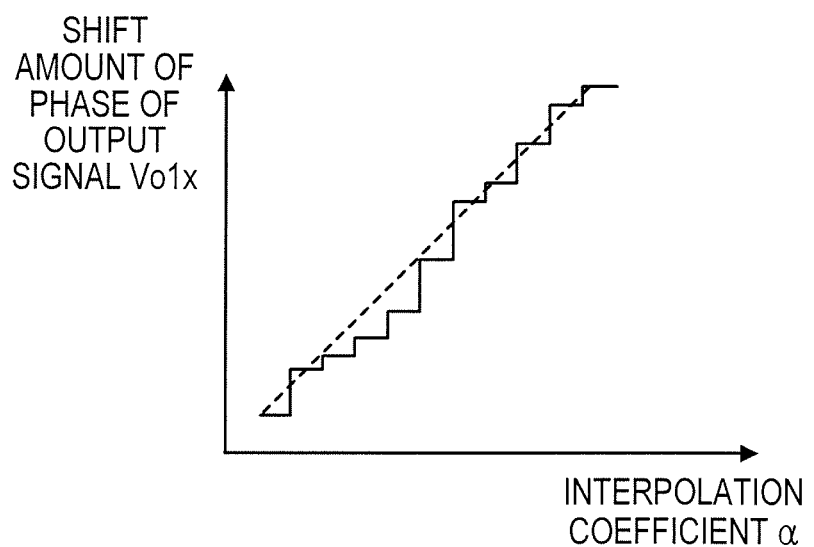
FIG. 6 is a drawing illustrating an exemplary relationship of an interpolation coefficient (a) and an amount of phase shift of an output signal at a high through rate.

FIG. 6 is a drawing illustrating an exemplary relationship between the interpolation coefficient α and an amount of phase shift of an output signal at a high through rate. The horizontal axis represents the interpolation coefficient α and the vertical axis represents an amount of phase shift of the output signal Vo1x.

As illustrated in FIG. 5, if the rise of the output signal Vo1x becomes non-linear, as illustrated in the solid line of FIG. 6, the amount of phase shift of the output signal Vo1x may not be changed linearly even when the interpolation coefficient α is changed at a constant step. The amount of phase shift is non-linearly changed with respect to the change of the interpolation coefficient α.

As described above, depending on the through rate, the change of the amount of the phase shift of the output signal Vo1x (similarly, the amount of phase shift of the output signal (Vo1) with respect to the change of the interpolation coefficient α may become a non-linear. In that case, it is not possible to precisely adjust the phase of the output signals Vo1, Vo1x.

Accordingly, in the phase control circuit 1 according to an embodiment of the present disclosure, the through rate is adjusted by the bias circuit 3 and the current controller 4, and, as illustrated in FIG. 4, the change of the shift amount of the phase of the output signals Vo1, Vo1x is set to be a linear change with respect to the change of the interpolation coefficient α.

Hereinafter, the operation of the bias circuit 3 of the phase control circuit 1 and the current controller 4 as illustrated in FIG. 1 will be described. In addition, hereinafter, for the simplicity of the explanation, the transistor size, which is determined by the gate width (W) and the gate length (L) of the transistors T1-T4 of the phase interpolation circuit 2 and the bias circuit 3, is defined as follows.

The ratio (W/L) of the gate width to the gate length of the transistor T4 is the same as the ratio (W/L) of the transistors T7, T8. In addition, the ratio (W/L) of the transistor T13 is 2 times of the ratio (W/L) of the transistors T1-T5. Also, the ratio (W/L) of the transistors T9-T12 is 0.5 times of the ratio (W/L) of the transistors T3, T6.

The bias currents Ib1, Ib2 determine the strength and the ratio of the bias currents I1, I2. In case of having a relationship of the transistor size discussed above, the bias currents Ib1, Ib2 become 0.5 times of the bias currents I1, I2, respectively.

In addition, in case of having a relationship of the transistor size discussed above, by the function of the current mirror, the same current as the bias current Ib1 flows in the drain of the transistor T10, and the same current as the bias current Ib2 flows in the drain of the transistor T12. Accordingly, the total value of the bias currents Ib1, Ib2 flows in the source of the transistor T13, that is, in the drain of the transistor 14.

Also, the same current flows between the drain-source of each of the transistors T14, T7, T8, and since each of the bias currents Ib1, Ib2 is 0.5 times of the bias currents I1, I2, respectively, the current that flows through the transistors becomes a half of the total value of the bias currents I1, I2. In addition, because the size of the transistors T7, T8, and T14 is the same with each other, the ON-resistance value also becomes to be equal.

As described above, when the transistor size is adjusted, the output common voltage of the phase interpolation circuit 2 becomes the same value as the voltage Vorep1 (the drain voltage of the transistor T14). If the total amount of the bias currents I1, I2 is changed, the voltage Vorep1 is also changed, but the operational amplifier amp1 adjusts the gate voltage of the transistors T7, T8, T14 in order to make the voltage Vorep1 to be consistent with the reference voltage Vcref1.

For example, if the total amount of the bias currents I1, I2 is increased, the voltage Vdd (a voltage of the power source VDD)–the voltage Vorep1 is increased, but the operational amplifier amp1 increases the gate voltage of the transistors T7, T8, and T14. As a result, the ON-resistance of the transistors T7, T8, and T14 is reduced, and the voltage Vdd–the voltage Vorep1 is decreased. By feedback control of the operational amplifier amp1, the voltage Vorep1 becomes the same as the reference voltage Vcref1. Because the voltage Vorep1 is the same as the output common voltage of the phase interpolation circuit 2, the output common voltage also becomes the reference voltage Vcref1.

As described above, by the feedback control of the operational amplifier amp1, the output common voltage is maintained as the reference voltage Vcref1 even though the total amount of the bias currents I1, I2 is changed. By using the bias circuit 3 described above, the output common voltage of the phase interpolation circuit 2 may be maintained as the reference voltage Vcref1 even though the total amount of the bias currents I1, I2 is changed.

In FIG. 1, as illustrated in FIG. 5, the waveforms of the voltages Vi1d, Vi2d and the output signal Vo1x are illustrated in the high through rate case. The rise and fall of the output signal Vo1x is set to be a non-linear.

The output signal Vo1x, for example, is used as a sampling clock that samples a received data in a receiving device (see, e.g., FIG. 13) which will be described later. If the rise or fall of the output signal Vo1x becomes non-linear, it is not possible to correctly sample the data. Accordingly, if the control unit of the receiving device determines that the output signal Vo1x is not proper, the control unit of the receiving device supplies a through rate control signal for instructing a decrease of the through rate to the current controller 4 based on the sampling result.

In order to decrease the through rate based on the through rate control signal, the current controller 4 sets the total amount of the bias currents Ib1, Ib2 to be small. As a result, the total amount of the bias currents Ib1, Ib2 in the phase interpolation circuit 2 is also reduced, and the waveform illustrated in the lower right-side of FIG. 1 is obtained. As described above, by controlling the through rate, it is possible to avoid the through rate that causes the distortion of the output signal, and the amount of phase shift of the output signals Vo1, Vo1x is linearly changed with respect to the interpolation coefficient α as illustrated in FIG. 4. Accordingly, it is possible to prevent the phase adjustment precision from being deteriorated, and the phase can be controlled widely and precisely.

In addition, when the through rate is controlled, the ON-resistance of the transistors T7, T8, T14 is automatically decreased by the function of the operational amplifier amp1 described above even though the total amount of the bias currents I1, I2 is increased. As a result, the output common voltage of the phase interpolation circuit 2 is maintained as the reference voltage Vcref1.

In addition, in a case where the total amount of the bias currents I1, I2 is decreased, the ON-resistance of the transistors T7, T8, T14 is automatically increased with the function of the operational amplifier amp1. As a result, the output common voltage of the phase interpolation circuit 2 is maintained as the reference voltage (Vcref1). As described above, even though the total amount of the bias currents I1, I2 is changed, the output common voltage is maintained, and the output common voltage of the phase interpolation circuit 2 is being changed. As a result, an occurrence of an incident where the operation of a circuit of a next stage is affected may be suppressed.

In addition, because the transistors T7, T8 becomes to be able to be operated in the saturation area as well as in the linear area, the operation frequency may be increased. Also, since the transistor having a smaller size can be used, the parasitic capacitance may be reduced.

In addition, the ratio of the transistor size of the bias circuit 3 and the phase interpolation circuit 2 is not limited to the relationship described above. For example, when the size of the transistor T14 is set to be 0.5 times of the size of the transistors T7, T8, the size of the transistor T13 may be set to be the size of the transistors T1, T2, T4, T5, and the size of the transistors T9, T10, T11, T12 may be set to be 0.25 times of the size of the transistors T3, T6.

In addition, in the transistors T3, T9, T10 that form a current mirror, the size may be changed as long as the size of the transistors T9, T10 maintains 0.5 times of the size of the transistor T3. For example, when the size of the transistors T3, T9, T10 is fixed to a constant size, it is assumed that the current controller 4 flows the bias current Ib1 of a certain current value to the transistor. If the size of the transistors T3, T9, T10 is set to 0.5 times, respectively, and the bias current IIb1 is also set to 0.5 times, the same operation may be performed.

It is possible to equally change the size of the transistor for the transistors T6, T11, T12.

Comparative Example

Figure 7:
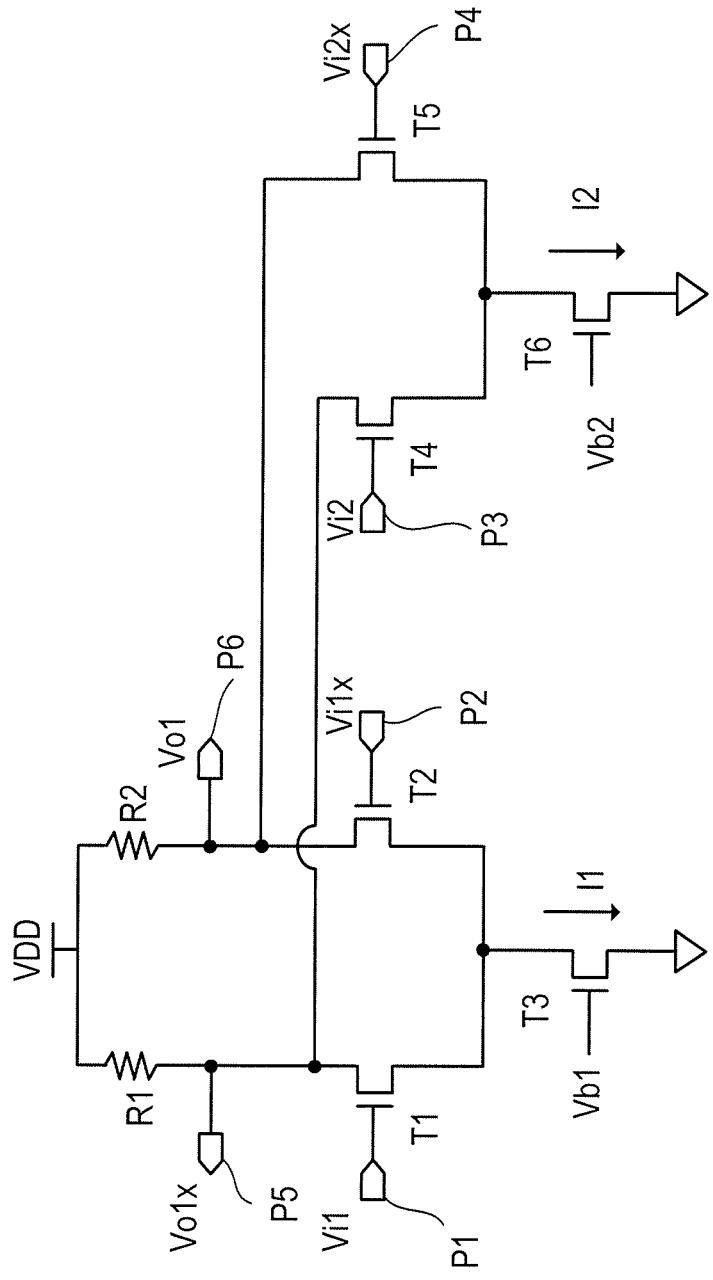
FIG. 7 is a drawing illustrating a first comparative example of the phase interpolation circuit.

FIG. 7 is a drawing illustrating a first comparative example of a phase interpolation circuit. In FIG. 7, the same symbols are assigned to the same elements as in the phase interpolation circuit 2 illustrated in FIG. 1.

The phase interpolation circuit 12 is different from the phase interpolation circuit 2 illustrated in FIG. 1, and the resistors R1, R2 are connected between the output terminals P5, P6 and the power source VDD. In the phase interpolation circuit 12, if the total amount of the bias currents I1, I2 is increased in order to control the through rate, the current that flows through the resistors R1, R2 is changed, and thus, the output common voltage of the phase interpolation circuit 12 may be changed.

In this case, in the phase interpolation circuit 1, the gate voltage of the transistors T7, T8 installed between the power source VDD and the output terminals P5, P6 is controlled by the bias circuit 3, even though the total amount of the bias currents I1, I2 is changed, the output common voltage is maintained. As a result, an effect against an operation of the circuit of the next step is prevented. In addition, because the transistors T7, T8 are used instead of the resistors R1, R2, the dimension of the circuit may be reduced.

Figure 8:
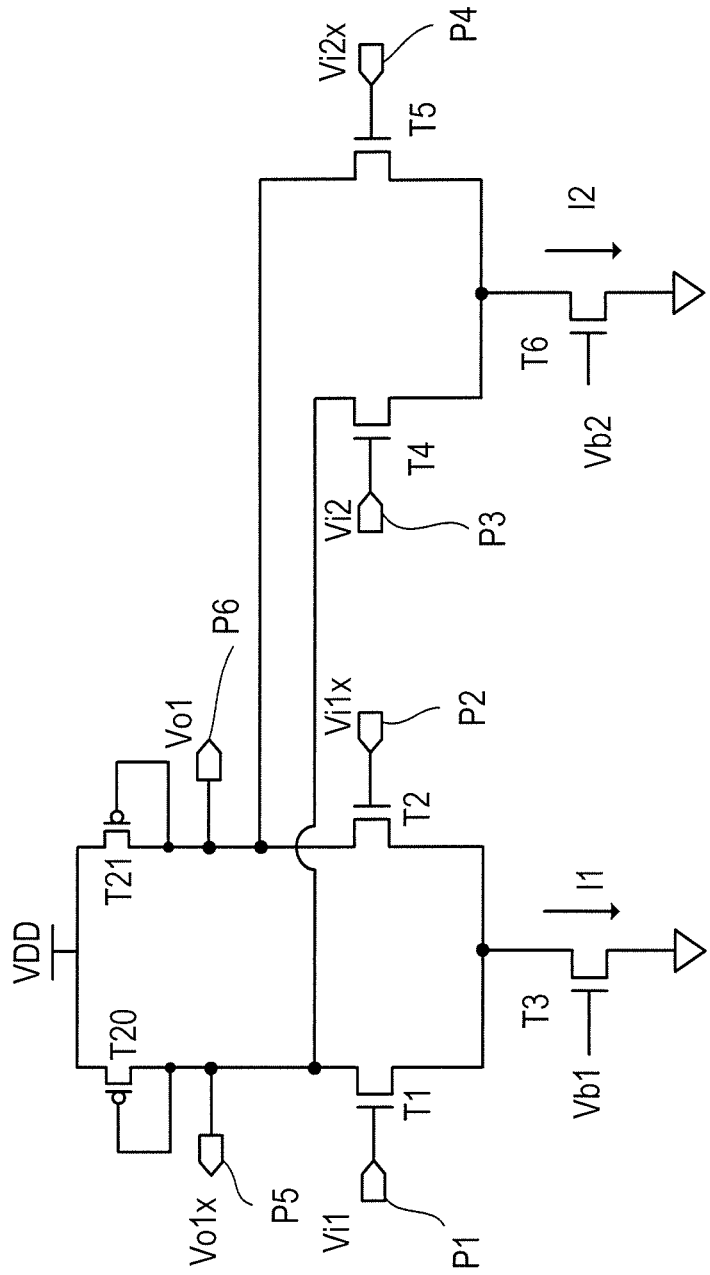
FIG. 8 is a drawing illustrating a second comparative example of the phase interpolation circuit.

FIG. 8 is a drawing illustrating a second comparative example of the phase interpolation circuit. The same symbols are assigned to the same elements as in the phase interpolation circuit 2 illustrated in FIG. 1.

The phase interpolation circuit 12a is different from the phase interpolation circuit 2 illustrated in FIG. 1, and the transistors T20, T21 of the p-channel type MOSFET are connected between the output terminals P5, P6 and the power source VDD.

The gate of the transistors T20, T21 is connected to its own drain. That is, the transistors T20, T21 are connected between the output terminals P5, P6 and the power source VDD as a diode.

In the phase interpolation circuit 12a, similarly to the phase interpolation circuit 2 according to an embodiment of the present disclosure, because the resistors R1, R2 as illustrated in FIG. 7 are not used, the dimension of the circuit may be reduced. However, because the gate of the transistors T20, T21 is connected to the output terminals P5, P6, the load connected to the output terminals P5, P6 is increased.

In this case, in the phase interpolation circuit 2 according to an embodiment of the present invention, because the gate of the transistors T7, T8 is not connected to the output terminals P5, P6, the load of the output terminals P5, P6 is reduced. As the load of the output terminals P5, P6 is reduced, a deterioration of the operation speed may be suppressed.

In addition, in the phase interpolation circuit 2, the gate of the transistors T7, T8 is not connected to its own drain (the output terminals P5, P6), but connected to the output terminal of the operational amplifier amp1 of the bias circuit 3 to apply the gate voltage.

Accordingly, a voltage that has a level lower than the output voltage may be applied to the gate of the transistors T7, T7. Accordingly, because the transistor having even smaller size may be applied to the transistors T7, T8, the parasitic capacitance may be reduced and the operation speed may be further increased.

In addition, in the phase interpolation circuit 12a, if the total amount of the bias currents I1, I2 is changed, the output common voltage of the phase interpolation circuit 12a is changed.

Figure 9:
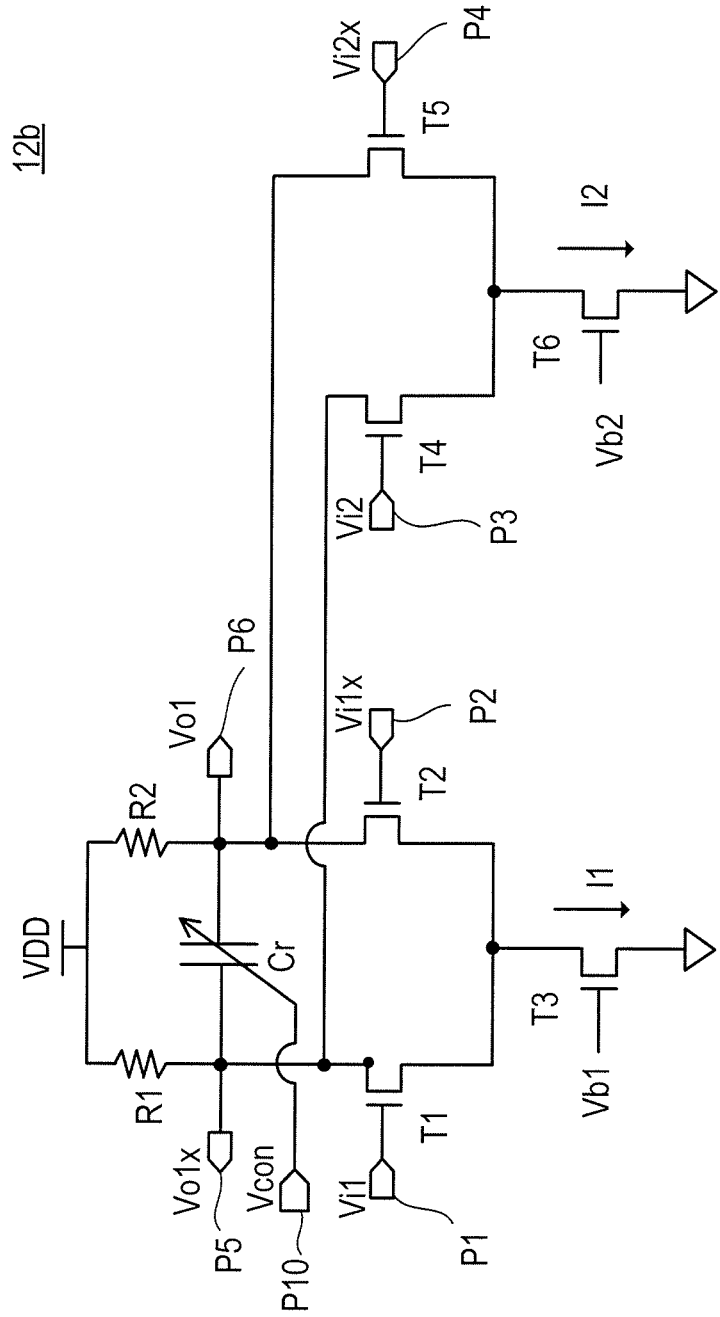
FIG. 9 is a drawing illustrating a third comparative example of the phase interpolation circuit.

FIG. 9 is a drawing illustrating a third comparative example of the phase interpolation circuit. The same symbols are assigned to the same elements as in the phase interpolation circuit 12 illustrated in FIG. 7. In the phase interpolation circuit 12b, a varactor Cr is connected between the drain of the transistor T1 and the drain of the transistor T2, and between the drain of the transistor T3 and the drain of the transistor T4. The capacitance value of the varactor (Cr) is controlled by a control voltage Vcon applied through the terminal P10 from the control unit (not illustrated).

In the phase interpolation circuit 12b, it is possible to control the through rate by controlling the capacitance value of the varactor Cr. Accordingly, because it is not necessary to change the total amount of the bias currents I1, I2, it is possible to maintain the output common voltage of the phase interpolation circuit 12b. However, because the variable scope of the capacitance value of the varactor Cr is limited, it is difficult to control the through rate in a broad scope. In addition, because the varactor Cr is connected to the output terminals P5, P6, the capacitance may be applied to the output terminals P5, P6 even though the capacitance value of the varactor Cr is set to the lowest value.

In this case, in the phase interpolation circuit 2 according to an embodiment of the present disclosure, it is possible to control the through rate in a relatively broad scope by changing the total amount of the bias currents I1, I2, and also, because the capacitance by the varactor (Cr) as described above is not applied, the deterioration of the operation speed may be suppressed.

Figure 10:
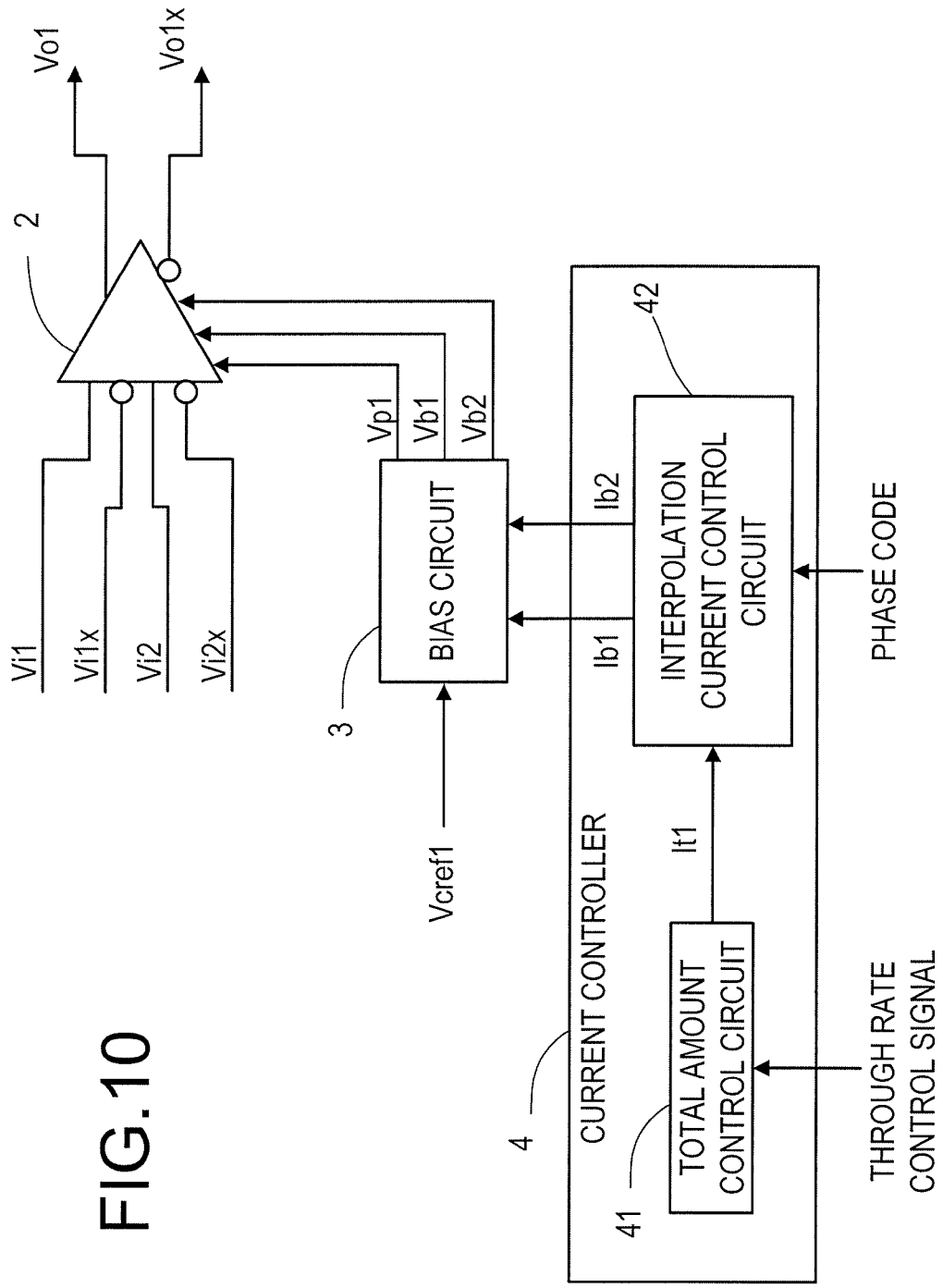
FIG. 10 is a drawing illustrating an entire configuration of a phase control circuit as an example.

Hereinafter, the entire configuration of the phase control circuit 1 will be described. FIG. 10 is a drawing illustrating the entire configuration of a phase control circuit as an example. The phase control circuit 1 includes the phase interpolation circuit 2, the bias circuit 3, and the current controller 4.

In addition, the current controller 4 includes a total amount control circuit 41, and an interpolation current control circuit 42. The total amount control circuit 41, for example, based on the through rate control signal provided from the control unit not described in the above description, controls a total bias current It1 that is a total amount of the bias currents Ib1, Ib2, and then provides the total amount of the bias currents Ib1, Ib2 to the interpolation current control circuit 42. For example, based on the through rate control signal, when the through rate is set to be relatively higher, the total amount control circuit 41 increases the total bias current It1, and when the through rate is set to be relatively lower, the total amount control circuit 41 decreases the total bias current It1.

The interpolation control circuit 42, for example, sets the interpolation coefficient α as described above according to the phase code provided from the control unit (not illustrated), and based on the interpolation coefficient α, the total bias current It1 is divided by a ratio of α:1−α into the bias currents Ib1, Ib2 to be provided to the bias circuit 3.

The bias circuit 3 generates the voltage Vp1 based on the reference voltage Vcref1 and then provides the voltage Vp1 to the phase interpolation circuit 2. In addition, the bias circuit 3 generates the bias voltages Vb1, Vb2 based on the bias currents Ib1, Ib2 provided from the interpolation current control circuit 42 and then provides the generated bias voltages Vb1, Vb2 to the phase interpolation circuit 2t.

The phase interpolation circuit 2 generates the output signals Vo1, Vo1x by interpolating the phase of the input signals vi1, vi2, vi1x, vi2x outputted from, for example, an oscillation circuit (not illustrated) based on the voltages Vp1, Vb1, Vb2 provided from the bias circuit 3.

In the phase control circuit 1 according to the embodiment of the present disclosure as described above, an example has been described in which the phase of the output signals Vo1, Vo1x is adjusted by interpolating the phase of four input signals Vi1, Vi1x, Vi2, Vi2x based on the ratio of the two bias currents I1, I2. However, the disclosure is not limited to this, and the phase of the output signal may be adjusted by interpolating the phase of five or more input signals based on a ratio of three or more bias currents.

Second Embodiment

Hereinafter, descriptions will be made on a case where the phase of the output signal is adjusted by interpolating the phase of eight input signals based on a ratio of four bias currents, according to a second embodiment of the present disclosure.

Figure 11:
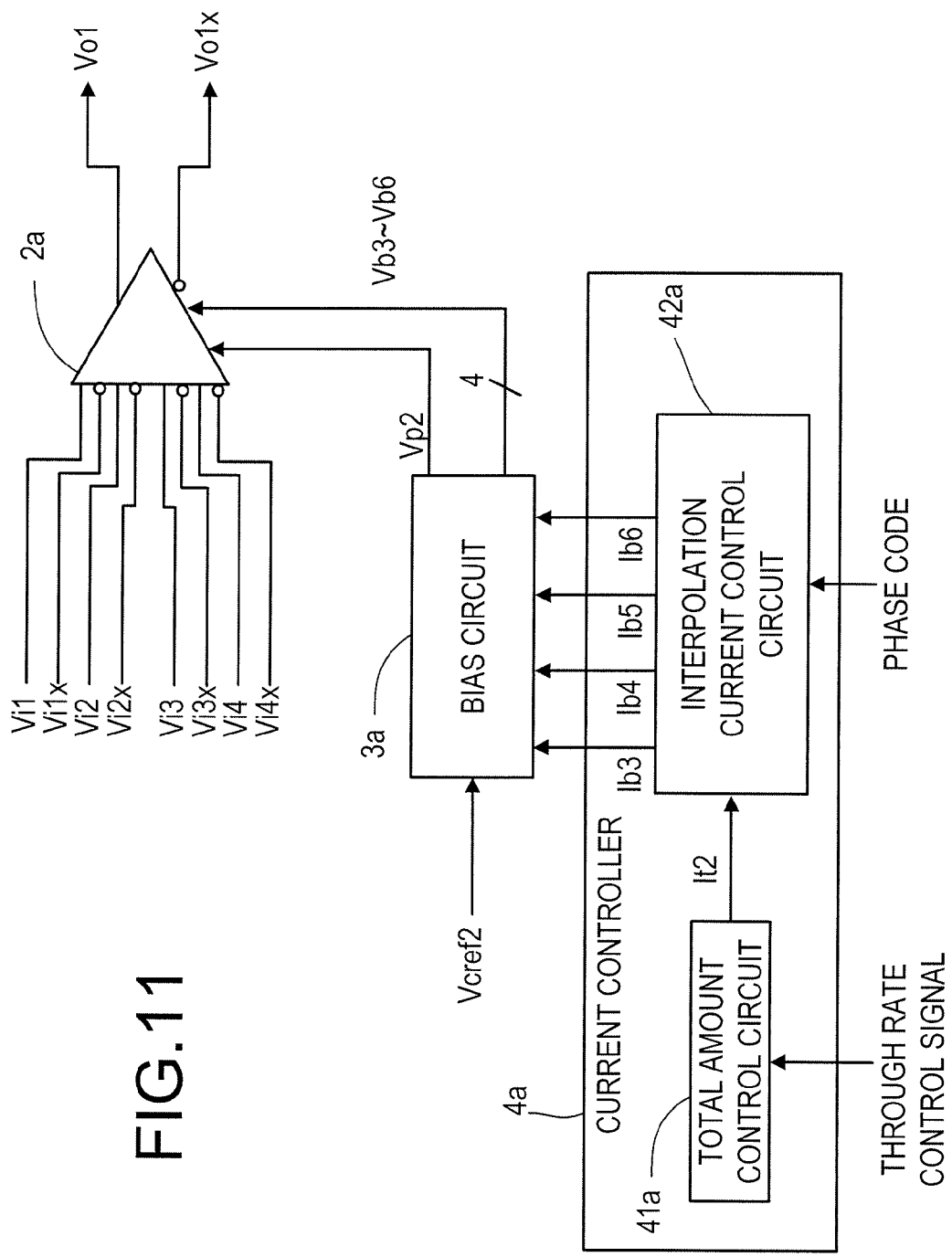
FIG. 11 is a drawing illustrating an entire configuration of a phase control circuit as an example according to a second embodiment of the present disclosure.

FIG. 11 is a drawing illustrating an entire configuration of a phase control circuit according to a second embodiment of the present disclosure. The phase control circuit 1a includes a phase interpolation circuit 2a, a bias circuit 3a, and a current controller 4a. In addition, the current controller 4a includes a total amount control circuit 41a and an interpolation current control circuit 42a.

The total amount control circuit 41a has similar function to the total amount control circuit 41 as illustrated in FIG. 10, and supplies the interpolation current control circuit 42a with the total bias current It2 based on the through rate control signal.

The interpolation current control circuit 42a sets the interpolation coefficient α according to the phase code, and then sets a ratio of the bias currents (Ib3, Ib4, Ib5, and Ib6)

based on the interpolation coefficient α. Then, the interpolation current control circuit 42a divides the total bias current It2 into the bias currents Ib3-Ib6 based on the ratio and then supplies the bias currents Ib3-Ib6 to the bias circuit 3a.

The bias circuit 3a generates a voltage Vp2 based on a reference voltage Vcref2 having a constant value, and then, supplies the generated voltage Vp2 to the phase interpolation circuit 2a. A voltage generated from, for example, a voltage generation unit (not illustrated) is used as the reference voltage Vcref2. In addition, the bias circuit 3a generates the bias voltages Vb3, Vb4, Vb5, Vb6 based on the bias currents Ib3-Ib6 supplied from the interpolation current control circuit 42a and supplies the bias voltages Vb3, Vb4, Vb5, Vb6 to the phase interpolation circuit 2a.

The phase interpolation circuit 2a, based on the voltages Vb3-Vb6 supplied from the bias circuit 3a, interpolates the phase of the input signals Vi1, Vi2, Vi3, Vi4, Vi1x, Vi2x, Vi3x, Vi4x, and then generates the output signals Vo1, Vo1x. The input signals Vi1-Vi4, Vi1x-Vi4x, for example, are supplied from, for example, an oscillation circuit (not illustrated). The plurality of input signals Vi1-Vi4, Vi1x-Vi4x have different phases with each other.

Figure 12:
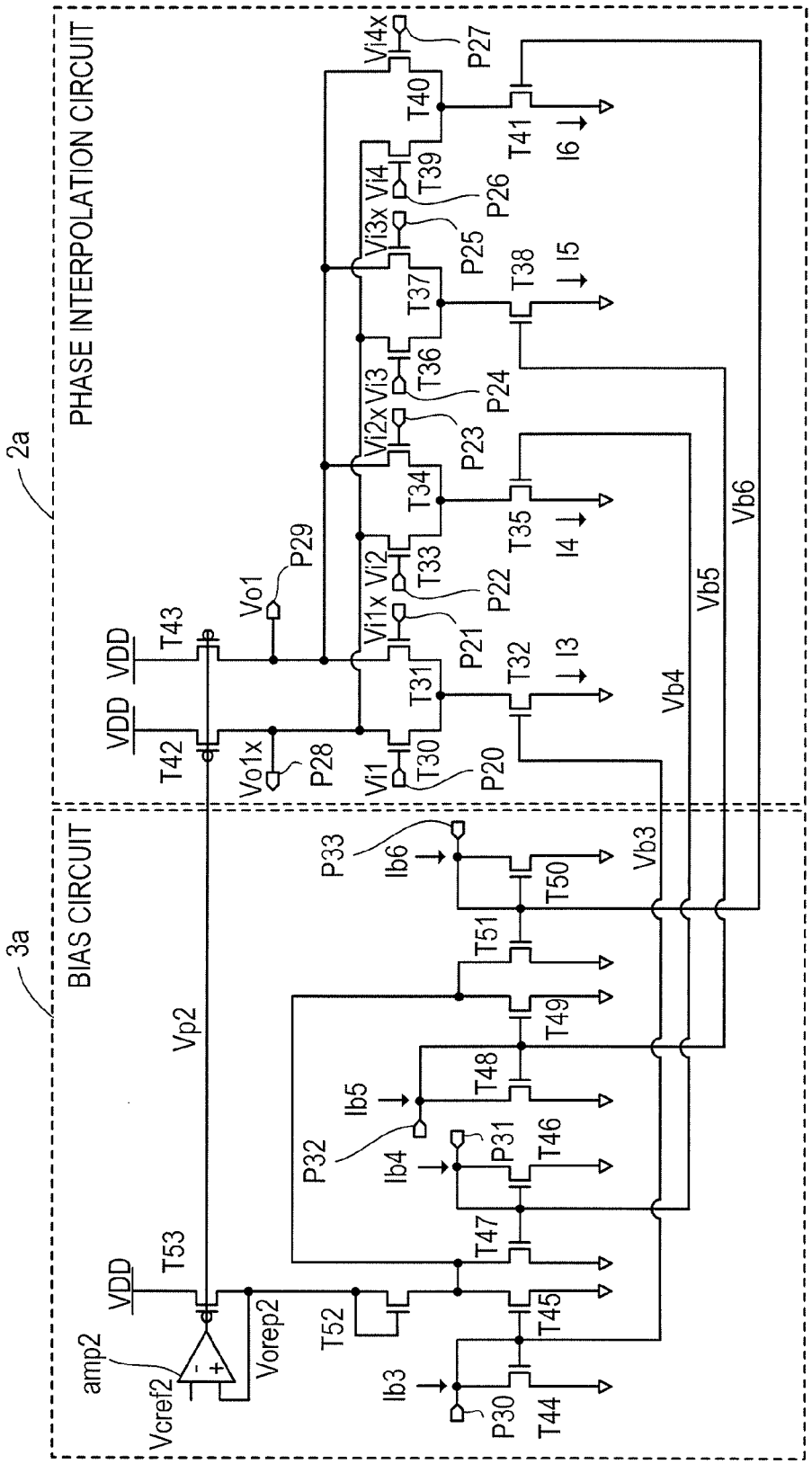
FIG. 12 is a drawing illustrating an example of a phase interpolation circuit and a bias circuit according to a second embodiment of the present disclosure.

FIG. 12 is a drawing illustrating an example of a phase interpolation circuit and a bias circuit according to a second embodiment of the present disclosure. The phase interpolation circuit 2a includes the transistors T30, T31, T32, T33, T34, T35, T36, T37, T38, T39, T40, T41, T42, T43.

Hereinafter, the transistors T30-T41 are described as n-channel type MOSFET, and the transistors T42, T43 are described as p-channel type MOSFET.

The drain of the transistors T30, T33, T36, T39 are connected to the drain of the transistor T42 and the output terminal P28. In addition, the drain of the transistors T31, T34, T37, and T40 is connected to the drain of the transistor T42 and the output terminal P28. The phase difference of the output signal Vo1x outputted from the output terminal P28 and the output signal Vo1 outputted from the output terminal P29 is 180 degrees.

In addition, the input signal Vi1 is inputted to the gate of the transistor T30 through the input terminal P20, and the input signal Vi1x is inputted to the gate of the transistor T31 through the input terminal P21. The input signal Vi2 is inputted to the gate of the transistor T33 through the input terminal (P22), and the input signal Vi2x is inputted to the gate of the transistor T34 through the input terminal P23.

The input signal Vi3 is inputted to the gate of the transistor T36 through the input terminal P24, and the input signal Vi3x is inputted to the gate of the transistor T37 through the input terminal P25. The input signal Vi4 is inputted to the gate of the transistor T39 through the input terminal P26, and the input signal Vi4x is inputted to the gate of the transistor T40 through the input terminal P27.

The source of the transistors T30, T31 is connected to the drain of the transistor T32, and the source of the transistors T33, T34 is connected to the drain of the transistor T35. In addition, the source of the transistors T36, T37 is connected to the drain of the transistor T38, and the source of the transistors T39, T40 is connected to the drain of the transistor T41.

The source of the transistors T32, T35, T38, and T41 is grounded. The bias voltage Vb3 is applied to the gate of the transistor T32, and when the transistor T32 receives the bias voltage Vb3, the transistor T32 flows the bias current I3 between the drain and the source thereof. The bias voltage Vb4 is applied to the gate of the transistor T35, and when the transistor T35 receives the bias voltage Vb4, the transistor T35 flows the bias current I4 between the drain and the source thereof.

The bias voltage Vb5 is applied to the gate of the transistor T38, and when the transistor T38 receives the bias voltage (Vb5, the transistor T38 flows the bias current I5 between the drain and the source thereof. The bias voltage Vb6 is applied to the gate of the transistor T41, and when the transistor T41 receives the bias voltage Vb6, the transistor T41 flows the bias current I6 between the drain and the source thereof.

The transistors T3, T4 are connected between the power source VDD and the output terminals P28, P29. The output terminal of an operational amplifier amp2 is connected to the gate of the transistors T42, T43, and the voltage Vp2 is applied to the gate of the transistors T42, T43.

The phase interpolation circuit 2a, based on a ratio of the bias currents I3-I6, outputs the output signals Vo1, Vo1x having different phases by combining a plurality of input signals Vi1-Vi4, Vi1x-Vi4x having different phases.

Meanwhile, the bias circuit 3a includes the transistors T44, T45, T46, T47, T48, T49, T50, T51, T52, T53 and the operational amplifier amp2.

Hereinafter, the transistors T44-T52 are described as n-channel type MOSFET, and the transistors T53 is described as p-channel type MOSFET.

The bias current Ib3 outputted from the interpolation current control circuit 42a through the terminal P30 is inputted to the drain of the transistor T44, and the source of the transistor T44 is grounded. The gate of the transistor T44 is connected its own drain, the gate of the transistor T45 and the gate of the transistor T32 of the phase interpolation circuit 2a. As a result, the gate voltage of the transistor T44 is applied to the gate of the transistor T32 as the bias voltage Vb3.

The source of the transistor T45 is grounded, and the drain of the transistor T45 is connected to the source of the transistor T52, the drain of the transistor T47, the drain of the transistor T49, and the drain of the transistor T51.

The bias current Ib4 outputted from the interpolation current control circuit 42a through the terminal P31 is inputted to the drain of the transistor T46, and the source of the transistor T46 is grounded. The gate of the transistor T46 is connected its own drain, the gate of the transistor T47, and the gate of the transistor T35 of the phase interpolation circuit 2a. Accordingly, the gate voltage of the transistor T46 is applied to the gate of the transistor T35 as the bias voltage Vb4.

The source of the transistor T47 is grounded, and the drain of the transistor T47 is connected to the source of the transistor T52, the drain of the transistor T45, the drain of the transistor T49, and the drain of the transistor T51.

The bias current Ib5 outputted from the interpolation current control circuit 42a through the terminal P32 is inputted to the drain of the transistor T48, and the source of the transistor T48 is grounded. The gate of the transistor T48 is connected its own drain, the gate of the transistor T49, and the gate of the transistor T38 of the phase interpolation circuit 2a. As a result, the gate voltage of the transistor T48 is applied to the gate of the transistor T38 as the bias voltage Vb5.

The source of the transistor T49 is grounded, and the drain of the transistor T49 is connected to a source of the transistor T52, the drain of the transistor T45, the drain of the transistor T47, and the drain of the transistor T51.

The bias current Ib5 outputted from the interpolation current control circuit 42a through the terminal P33 is inputted to the drain of the transistor T50, and the source of the transistor T50 is grounded. The gate of the transistor T50 is connected its own drain, the gate of the transistor T51, and the gate of the transistor T41 of the phase interpolation circuit 2a. As a result, the gate voltage of the transistor T50 is applied to the gate of the transistor T41 as the bias voltage Vb6.

The source of the transistor T51 is grounded, and the drain of the transistor T51 is connected to the source of the transistor T52, the drain of the transistor T45, the drain of the transistor T47, and the drain of the transistor T49.

The drain of the transistor T52 is connected to its own gate, the drain of the transistor T53, and the non-inverted input terminal of the operational amplifier amp2. The gate of the transistor T53 is connected to the gate of the transistors T42, 43 and the output terminal of the operational amplifier amp2. The power source VDD is connected to the source of the transistor T53. In FIG. 12, the drain voltage of the transistor T53 is represented as a voltage Vorep2.

The reference voltage Vcref2 is applied to the non-inverted input terminal of the operational amplifier amp2. A voltage generated from, for example, a voltage generation unit (not illustrated) is used as the reference voltage Vcref2. The operational amplifier amp2 has similar function to the operational amplifier amp1 described above. That is, if the total amount of the bias currents I3-I6 is changed, the voltage Vorep2 is also changed, but the operational amplifier amp2 adjusts the gate voltage of the transistors T42, T43, T53 to match the voltage Vorep2 with the reference voltage Vcref2.

In the bias circuit 3a, as in the first embodiment of the present disclosure, even though the total amount of a plurality of the bias currents I3-I6 of the phase interpolation circuit 2a is changed, the output common voltage of the phase interpolation circuit 2a is maintained as the reference voltage Vcref2.

Accordingly, in the phase control circuit 1a of the second embodiment as described above, it is possible to have an effect that is the same as the phase control circuit 1 of the first embodiment.

In addition, when the output signal Vo1 is generated, the phase interpolation circuit 2a may be generated, for example, by interpolating the phase of all of four input signals among the input signals Vi1-Vi4, or may be generated by interpolating the phase of two input signals as well.

As mentioned above, the phase control circuit 1, 1a of the first and second embodiments may be applied, for example, to the receiving device of a high speed transmission system.

Figure 13:
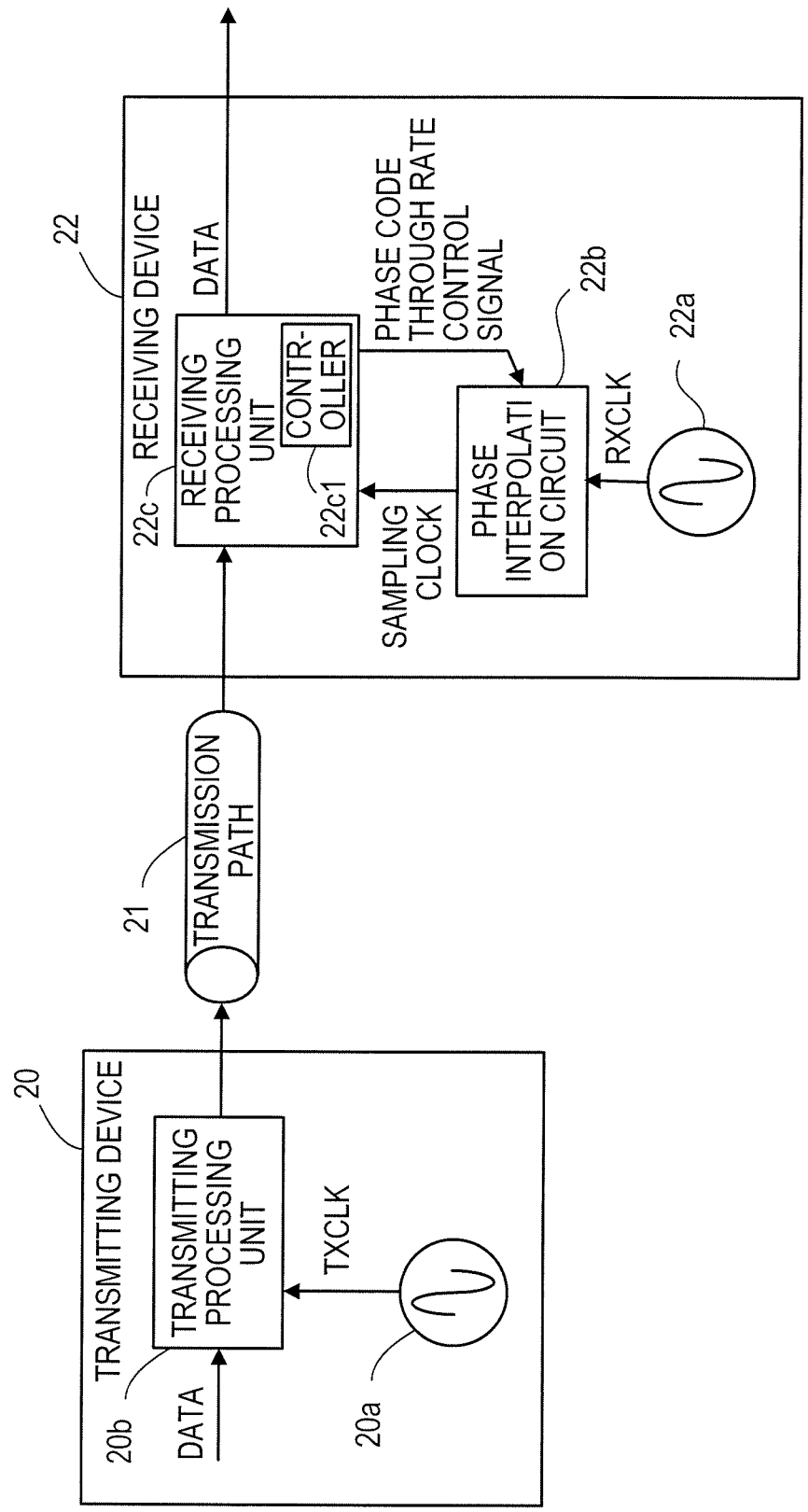
FIG. 13 is a drawing illustrating an example of a high speed signal transmission system.

FIG. 13 is a drawing illustrating an example of a high speed signal transmission system. In the high speed transmission system of FIG. 13, an example is illustrated in which the transmitting device 20 transmits data to the receiving device 22 through a transmission path.

The transmitting device 20 includes an oscillation circuit 20a and a transmitting processing unit 20b. The oscillation circuit 22a generates a clock signal TXCLK, and then outputs the clock signal TXCLK to the transmitting processing unit 20b. The transmitting processing unit 20b overlaps the clock signal TXCLK to the inputted data, and transmits the overlapped data to the receiving device 22 through the transmission path 21.

The receiving device 22 includes an oscillation circuit 22a, a phase control circuit 22b, and a receiving processing unit 22c. The oscillation circuit 22a generates a clock signal (reference clock) (RXCLK), and then supplies the clock signal RXCLK to the phase control circuit 22b.

The phase control circuit 22b functions as the phase control circuit 1 described above or the phase control circuit 1a based on the phase code described above or on the through rate control signal supplied from a control unit 22c1 of the receiving processing unit 22c. In an example of FIG. 13, the phase control circuit 22b, based on the phase code, interpolates phases of a plurality of clock signals RXCLK having a plurality of different phases, and then generates a sampling clock to output the sampling clock to the receiving processing unit 22c.

The receiving processing unit 22c, based on the sampling clock supplied from the phase control circuit 22b, samples received data and then reproduces data or a clock. In addition, the control unit 22c1, for example, based on the reproducing result, supplies the phase code or the through rate control signal to the phase control circuit 22b. For example, when a distortion illustrated in FIG. 5 is detected from the sampling clock, the through rate control signal that, for example, reduces the through rate (delays the rise or fall of the sampling clock) is supplied to the phase control circuit 22b.

Figure 14:
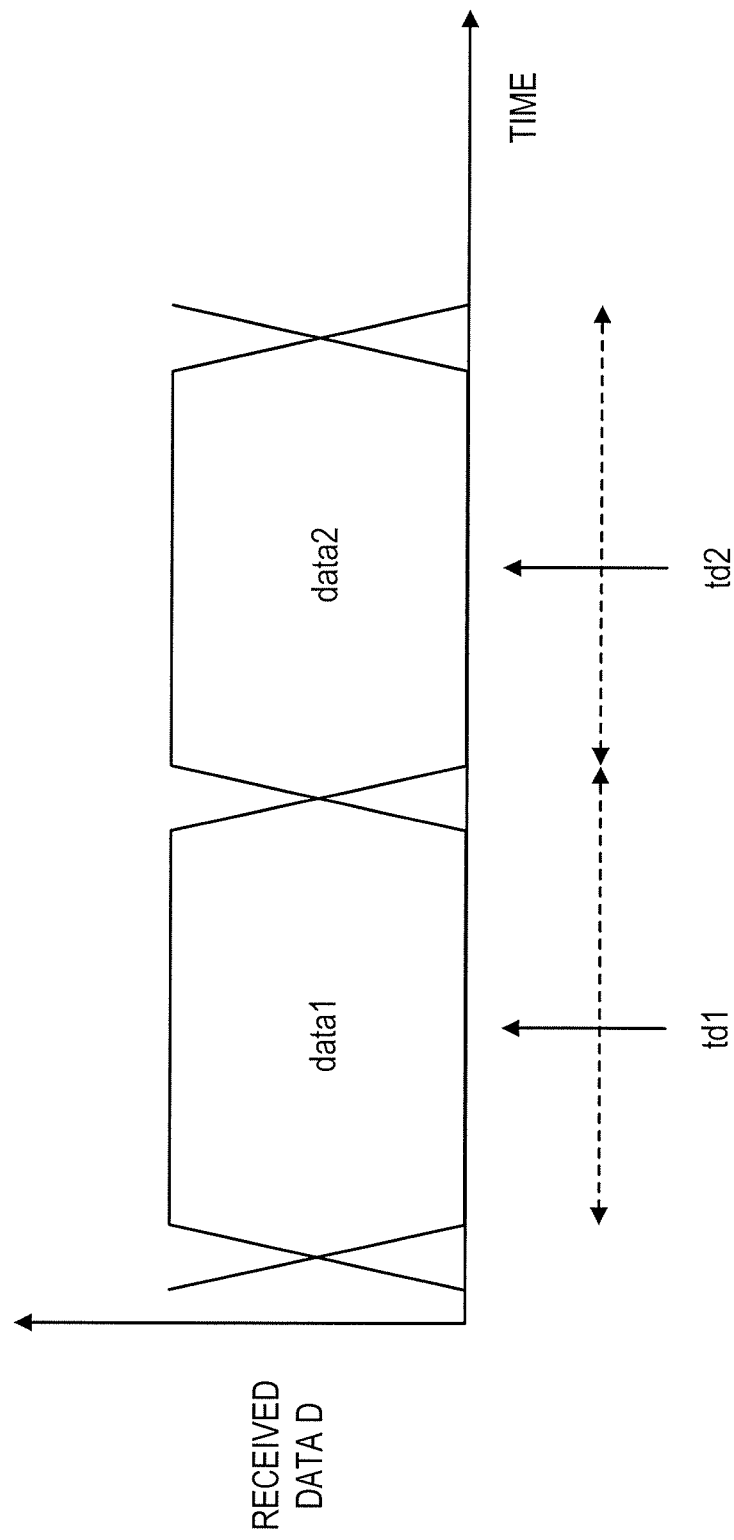
FIG. 14 is a drawing illustrating an exemplary relationship of a received data and a sampling time.

FIG. 14 is a drawing illustrating an exemplary relationship of received data and a sampling time. The sampling timings td1, td2 are represented in FIG. 14 for a case where the sampling is done at the center of the received data D (data1, data2).

By applying the phase control circuits 1, 1a described above as the phase control circuit 22b, it is possible to precisely control the phase of the sampling clock in a broad scope, therefore, it is possible to set more precise and suitable sampling timing.

In addition, the phase interpolation circuit and the bias circuit are not limited to the above example. In the phase control circuit of the first and second embodiments of the present disclosure, it is possible to change the transistor of n-channel type MOSFET into p-channel type MOSFET, or the transistor of p-channel type MOSFET into n-channel type MOSFET. Hereinafter, the modification of the phase control circuit 1 according to the first embodiment of the present disclosure is represented in FIG. 15.

Modification

Figure 15:
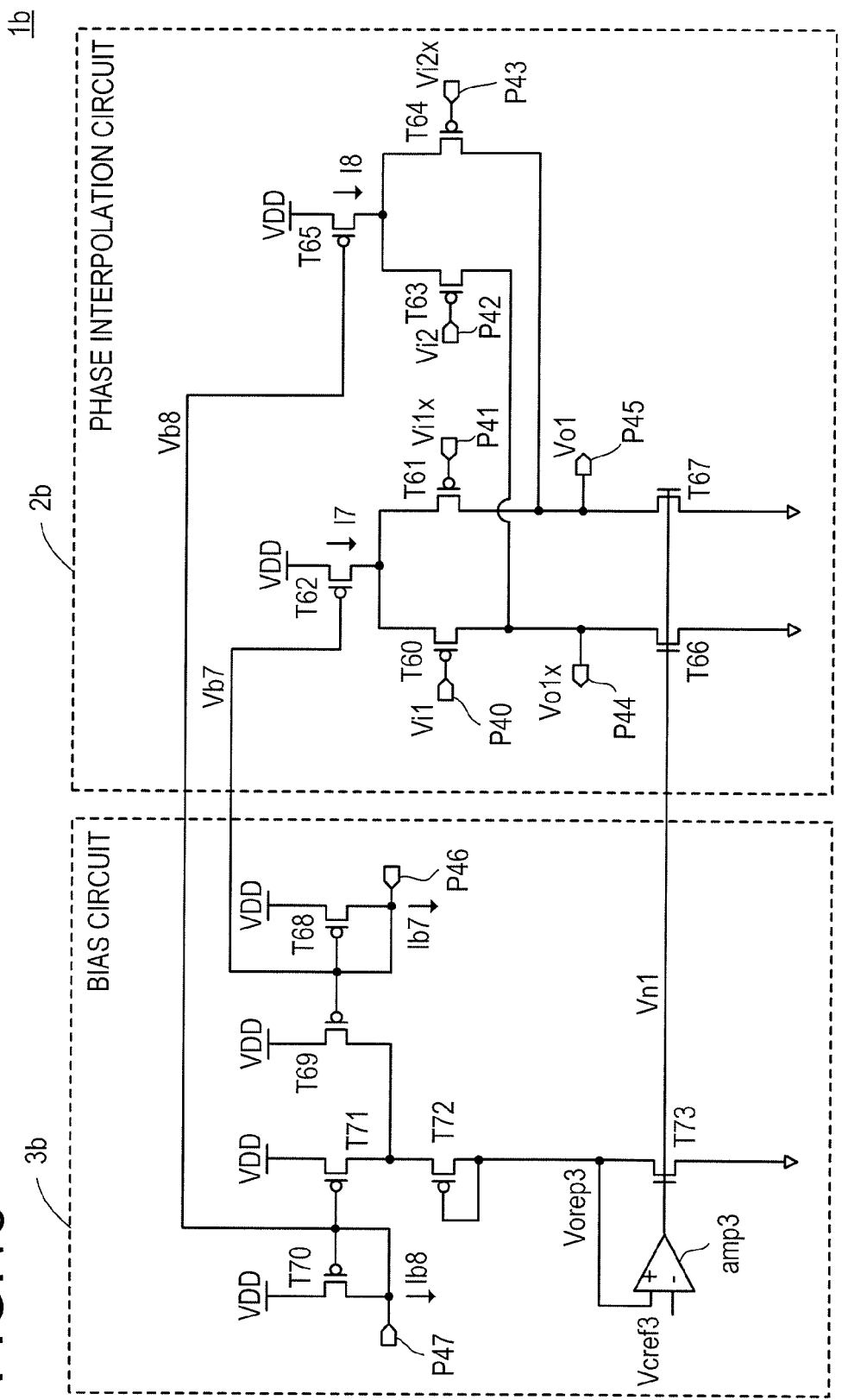
FIG. 15 is a modified example of a phase control circuit.

FIG. 15 is a drawing illustrating a modification of the phase control circuit. The phase control circuit 1b includes a phase interpolation circuit 2b and a bias circuit 3b. The phase interpolation circuit 2b includes the transistors T60, T61, T62, T64, T65, T66, and T67.

Hereinafter, the transistors T60-T65 are described as p-channel type MOSFET, and the transistors T66-T67 are described as n-channel type MOSFET.

The input terminal P40 is connected to the gate of the transistor T60, and the input signal Vi1 is inputted to the gate of the transistor T60. The input terminal P41 is connected to the gate of the transistor T61, and the input signal Vi1x is inputted to the gate of the transistor T61. The sources of the transistors T60, T61 are connected to the drain of the transistor T62. In addition, the drain of the transistor T60 is connected to the drain of the transistor T66 and the input terminal P44, the drain of the transistor T61 is connected to the drain of the transistor 67 and the input terminal P45. The phase difference of the output signal Vo1x outputted from the output terminal P44 and the output signal Vo1 outputted from the output terminal P45 is 180 degrees.

The power source VDD is connected to the source of the transistor T62, and the bias voltage Vb7 is applied to the gate. When the bias voltage Vb7 is received, the transistor T62 flows the bias current I7 between the drain and the source thereof.

The input terminal P42 is connected to the gate of the transistor T63, and then the input signal Vi2 is inputted. The input terminal P43 is connected to the gate of the transistor T64, and then the input signal Vi2x is inputted to the gate of the transistor T64. The source of the transistors T63, T64 is connected to the drain of the transistor T65. In addition, the drain of the transistor T63 is connected to the drain of the transistor T66 and the output terminal P44, and the drain of the transistor T64 is connected to the drain of the transistor T67 and the output terminal P45.

The source of the transistor T65 is connected to the power source VDD, and the bias voltage Vb8 is applied to the gate of the transistor T65. When the bias voltage Vb8 is received, the transistor T65 flows the bias current I8 between the source and the drain thereof.

The output terminal of the operational amplifier amp3 is connected to the gate of the transistor T66 to input the voltage Vn1. In addition, the source of the transistor T66 is grounded (connected to the reference voltage). The output terminal of the operational amplifier amp3 is connected to the gate of the transistor T67, and the voltage Vn1 is applied. In addition, the source of the transistor T67 is grounded (e.g., connected to the reference voltage).

In the phase interpolation circuit 2b, the transistors T66, T67 function as the load resistance of two input differential pair (transistors T60, T61, transistors T63, T64).

The phase interpolation circuit 2b, based on the ratio of the bias currents I7, I8, outputs the output signals Vo1, Vo1x having a separate phase by combining the bias currents Vi1, Vi2, Vi1x, Vi2x.

Meanwhile, the bias circuit 3b includes the transistors T68, T69, T70, T71, T72, T73 and the operational amplifier amp3.

Hereinafter, the transistors T68-T72 are described as n-channel type MOSFET, and the transistor T73 is described as p-channel type MOSFET.

The bias current Ib7 is inputted to the drain of the transistor T68 through the terminal P46, and the power source VDD is connected to the source of the transistor T68. The gate of the transistor T68 is connected to its own drain, the gate of the transistor T69, and the gate of the transistor T62 of the phase interpolation circuit 2b. Accordingly, the gate voltage of the transistor T68 is applied to the gate of the transistor T62 as the bias voltage Vb7.

The power source VDD is connected to the source of the transistor T69. The drain of the transistor T69 is connected to the source of the transistor T72 and the drain of the transistor T71.

The bias current Ib8 is inputted to the drain of the transistor T70 through the terminal P47, and the power source VDD is connected to the source of the transistor T70. The gate of the transistor T70 is connected to its own drain, the gate of the transistor T71, and the gate of the transistor T65 of the phase interpolation circuit 2b. As a result, the gate voltage of the transistor T70 is applied to the gate of the transistor T65 as the bias voltage Vb8.

The power source VDD is connected to the source of the transistor T71. The drain of the transistor T71 is connected to the source of the transistor T72 and the drain of the transistor T69.

The drain of the transistor T72 is connected to its own gate, the drain of the transistor 73, and the non-inverted input terminal of the operational amplifier amp3.

The gate of the transistor T73 is connected to the gate of the transistors T66, T67, and the input terminal of the operational amplifier amp3, and the source of the transistor T73 is grounded. In FIG. 15, the drain voltage of the transistor T73 is represented as a voltage Vorep3.

The reference voltage Vcref3 is applied to the inverted input terminal of the operational amplifier amp3. For example, a voltage generated at the voltage generation unit (not illustrated) is used as the reference voltage Vcref3. The operational amplifier amp3 has similar function to the operational amplifiers amp1, amp2 described above.

The bias circuit 3b, based on the total amount of the bias currents I7, I8, controls the ON-resistance by adjusting the gate voltage of the transistors T66, T67, and maintains the output common voltage of the phase interpolation circuit 2b as the reference voltage Vcref3 regardless of the total amount.

Accordingly, in the phase control circuit 1b, it is possible to have an effect similar to the phase control circuits 1, 1a of the first and second embodiments. In the above description, while an aspect of the phase control circuit and the receiving device of the present disclosure has been described, it is only an illustration and the present disclosure is not limited thereto.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A phase control circuit comprising:
   a phase interpolation circuit including a first transistor connected between a power source and an output terminal, and configured to output an output signal from the output terminal by combining a plurality of input signals having different phases with each other based on a ratio of a plurality of input bias currents;
   a bias circuit configured to control an ON-resistance of the first transistor by adjusting a gate voltage of the first transistor based on a total amount of the plurality of input bias currents, and to maintain an output common voltage of the phase interpolation circuit regardless of the total amount; and
   a current controller configured to control a through rate of the output signal with respect to the plurality of input signals by adjusting the total amount.

2. The phase control circuit according to claim 1, wherein the bias circuit includes a comparison circuit configured to compare a first voltage changing based on the total amount with a second voltage having a constant value, the first voltage having a same value as the output common voltage, so that the first voltage becomes equal to the second voltage.

3. The phase control circuit according to claim 2,
   wherein the bias circuit includes a second transistor in which the power source is connected to any one of a source and a drain and the first voltage is applied to the other of the source and the drain so that a current flows between the source and the drain based on the total amount, and
   wherein the comparison circuit, based on a comparison result of the first voltage and the second voltage, adjusts gate voltages applied to the first transistor and the second transistor so that the first voltage becomes equal to the second voltage.

4. The phase control circuit according to claim 3, wherein each transistor size of the first transistor and the second transistor is adjusted so that the first voltage have the same value as the output common voltage.

5. A phase control circuit comprising:
a phase interpolation circuit including a transistor connected between a power source and an output terminal, and configured to output an output signal from the output terminal by combining a plurality of input signals having different phases with each other based on a ratio of a plurality of input bias currents; and
a bias circuit configured to control an ON-resistance of the transistor by adjusting a gate voltage of the transistor based on a total amount of the plurality of input bias currents, and to maintain an output common voltage of the phase interpolation circuit regardless of the total amount.

6. A receiving device comprising:
a phase control circuit including
a phase interpolation circuit including a first transistor connected between a power source and an output terminal, and configured to output an output signal from the output terminal by combining a plurality of input signals having different phases with each other based on a ratio of a plurality of input bias currents,
a bias circuit configured to control an ON-resistance of the first transistor by adjusting a gate voltage of the first transistor based on a total amount of the plurality of input bias currents, and to maintain an output common voltage of the phase interpolation circuit regardless of the total amount, and
a current controller configured to control a through rate of the output signal with respect to the plurality of input signals by adjusting the total amount; and
a receiving processing unit configured to sample a received data based on the output signal.

* * * * *